(12) United States Patent
Bjorksten et al.

(10) Patent No.: US 7,221,188 B2
(45) Date of Patent: May 22, 2007

(54) LOGIC CIRCUITRY

(75) Inventors: Andrew A. Bjorksten, Austin, TX (US); Khoi B. Mai, Austin, TX (US); Paul C. Rossbach, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 123 days.

(21) Appl. No.: 10/967,563

(22) Filed: Oct. 18, 2004

(65) Prior Publication Data

US 2006/0082388 A1 Apr. 20, 2006

(51) Int. Cl.
*H03K 19/096* (2006.01)
(52) U.S. Cl. .......................... 326/95; 326/98
(58) Field of Classification Search ................. 326/93, 326/95–98
See application file for complete search history.

(56) References Cited

U.S. PATENT DOCUMENTS

| | | | |
|---|---|---|---|
| 5,291,076 A | 3/1994 | Bridges | |
| 5,828,234 A | 10/1998 | Sprague | |
| 5,933,038 A * | 8/1999 | Klass | 327/208 |
| 5,986,475 A | 11/1999 | Kim et al. | |
| 6,239,621 B1 | 5/2001 | Milshtein et al. | |
| 6,316,960 B2 * | 11/2001 | Ye | 326/95 |
| 6,407,585 B1 | 6/2002 | Vinh | |
| 6,459,304 B1 | 10/2002 | Naffziger | |
| 6,646,487 B2 * | 11/2003 | Nedovic et al. | 327/211 |
| 6,690,204 B1 * | 2/2004 | Belluomini et al. | 326/95 |

OTHER PUBLICATIONS

Naffziger et al., "The Implementation of the Itanium 2 Microprocessor," IEEE Journal of Solid-State Circuits, vol. 37, No. 11, Nov. 2002, pp. 1448-1460.
Nambu et al., "A 1.8-ns Access, 550-MHz, 4.5-Mb CMOS SRAM," IEEE Journal of Solid-State Circuits, vol. 33, No. 11, Nov. 1998, pp. 1650-1658.

* cited by examiner

*Primary Examiner*—James H. Cho
(74) *Attorney, Agent, or Firm*—David G. Dolezal

(57) ABSTRACT

A logic circuit including at least one evaluate circuit coupled to a static output logic circuit. In one example, the evaluate circuit includes a dynamic node, a full keeper, an evaluate device, and a logic tree. In some examples, the output logic circuit is a sampled static output logic circuit and includes a sample device. In some examples, the logic circuit includes multiple evaluate circuits, each with a dynamic node coupled to a control gate of a transistor of the output logic circuit. Some examples may include a delay in a clock signal to increase the internal race margin.

36 Claims, 4 Drawing Sheets

LOGIC CIRCUITRY

BACKGROUND

1. Field

The present invention relates to electronic circuits, and more particularly, to logic circuits.

2. Description of the Related Art

Dynamic circuitry utilizes synchronous logic circuits that generate an output with dynamic signaling characteristics depending upon a predetermined combination of inputs. Such circuitry is typically characterized by two operational phases, a precharge phase and an evaluate phase. In the precharge phase, a node (e.g., a dynamic node) is precharged to a known or predetermined voltage level. In the evaluate phase, a logic array or logic "tree" of transistors is given the opportunity to discharge the node to a second known or predetermined voltage level or to allow the precharge to persist. In some examples, each input is coupled, typically, to a gate (control terminal) of one or more of the transistors in the logic tree. The final charge on the dynamic node may thereby be controlled by the particular values of the inputs and by the way the transistors are coupled within the tree. Conventionally, the final voltage of the dynamic node, high or low, provides the logical output of a dynamic logic gate after being suitably buffered, and perhaps inverted. Each of these two phases correspond to one of the two clock states of a clock signal cycle to which the dynamic circuitry is synchronized. Most examples of a dynamic circuit precharge the node when the clock is low and evaluate the node when the clock is high.

Two common uses for dynamic circuits are as decoders and as comparators. Decoders output a unique signal if and only if all of the bits of an input match a predetermined set of values. A decoder may thereby enable a particular write line in a matrix of memory cells if and only if an input memory address matches,the predetermined address of a line of memory cells. Similarly, a digital comparator will output a unique signal if and only if two sets of inputs, each containing multiple data bits, are identical. Other uses of dynamic circuits devices include tag arrays and select signals in CAM arrays, arithmetic functions, and other types of circuitry, e.g., in which computation of multi-bit NAND, AND, NOR, or OR functions are desirable, e.g., where time-critical wide-ANDing or ORing is desired.

The particular way the inputs are combined within the logic tree of a dynamic circuit device determines the particular operating characteristics, and hence, the particular name of the dynamic circuit device. Any Boolean function can be implemented as a dynamic circuit device by constructing the tree such that the tree causes the dynamic node to discharge when the Boolean function is either true or false, as needed by the designer. When driving static logic, it is not consequential whether a tree allows the charge on a dynamic node to persist when the Boolean function is true or to persist when the function is false, because an inverter can be used to obtain the desired polarity. However, when driving dynamic logic, the polarity is consequential.

A dynamic circuit device can be implemented in one of two logically equivalent ways. The two implementations correspond to a tree that discharges the charged node when the Boolean function is true and to a tree that discharges the charged node when the Boolean function is false. When the dynamic circuit device discharges the node if the Boolean function is true, it is said to "evaluate to the active state." When the dynamic circuit device discharges the node if the Boolean function is false, it is said to "evaluate to the inactive state." One of these implementations uses its inputs connected in a manner to describe a particular function. The second implementation uses the complements of the inputs and a second function. DeMorgan's law allows the designer to restructure the tree of the first function to produce a tree for the second function. The second function is the first function's complement.

Although logically equivalent, each of the two possible implementations of a dynamic circuit device has its own disadvantages. Specifically, the more transistors coupled in series within the tree, the slower the performance of the dynamic circuit device. This disadvantage is typically associated with a dynamic circuit device that implements an AND that discharges the charged node when its function is true. Conversely, a dynamic circuit device that evaluates to the inactive state may generate an output unacceptable to many types of circuits such as e.g. a dynamic circuit that discharges the charged node when its function is false.

There is a constant need to provide faster, smaller, and lower power implementations of comparators used in different circuit blocks (e.g., CAMs, cache tag arrays), various arithmetic functions, and selected address decode units. A more robust, larger fan-in, faster logical NAND/NOR and AND/OR circuit is desirable for use in wide comparators or wide zero detect circuits, especially for 32 bit and higher architectures.

Prior approaches have failed to provide a functional NAND output (e.g., a statically driven node with dynamic signaling characteristics without additional buffering), have inherent susceptibility to noise introduced from the output, have failed to handle multiple dynamic evaluation nodes properly and consistently, have failed to recover from miss-evaluations, have failed to provide sufficiently flexible control of the dynamically necessary internal race, and have failed to allow input signals from resetting early.

What is desired is an improved logic circuit.

BRIEF DESCRIPTION OF THE DRAWINGS

The present invention may be better understood, and its numerous objects, features, and advantages made apparent to those skilled in the art, by referencing the accompanying drawings. The use of the same reference symbols in different drawings indicates similar or identical items.

The use of the same reference symbols in different drawings indicates identical items unless otherwise noted. The figures are not necessarily drawn to scale.

DETAILED DESCRIPTION

The following discussion is intended to provide a detailed description of at least one example of the invention and should not be taken to be limiting of the invention itself. Rather, any number of variations may fall within the scope of the invention which is properly defined in the claims following this description.

Figure 1:
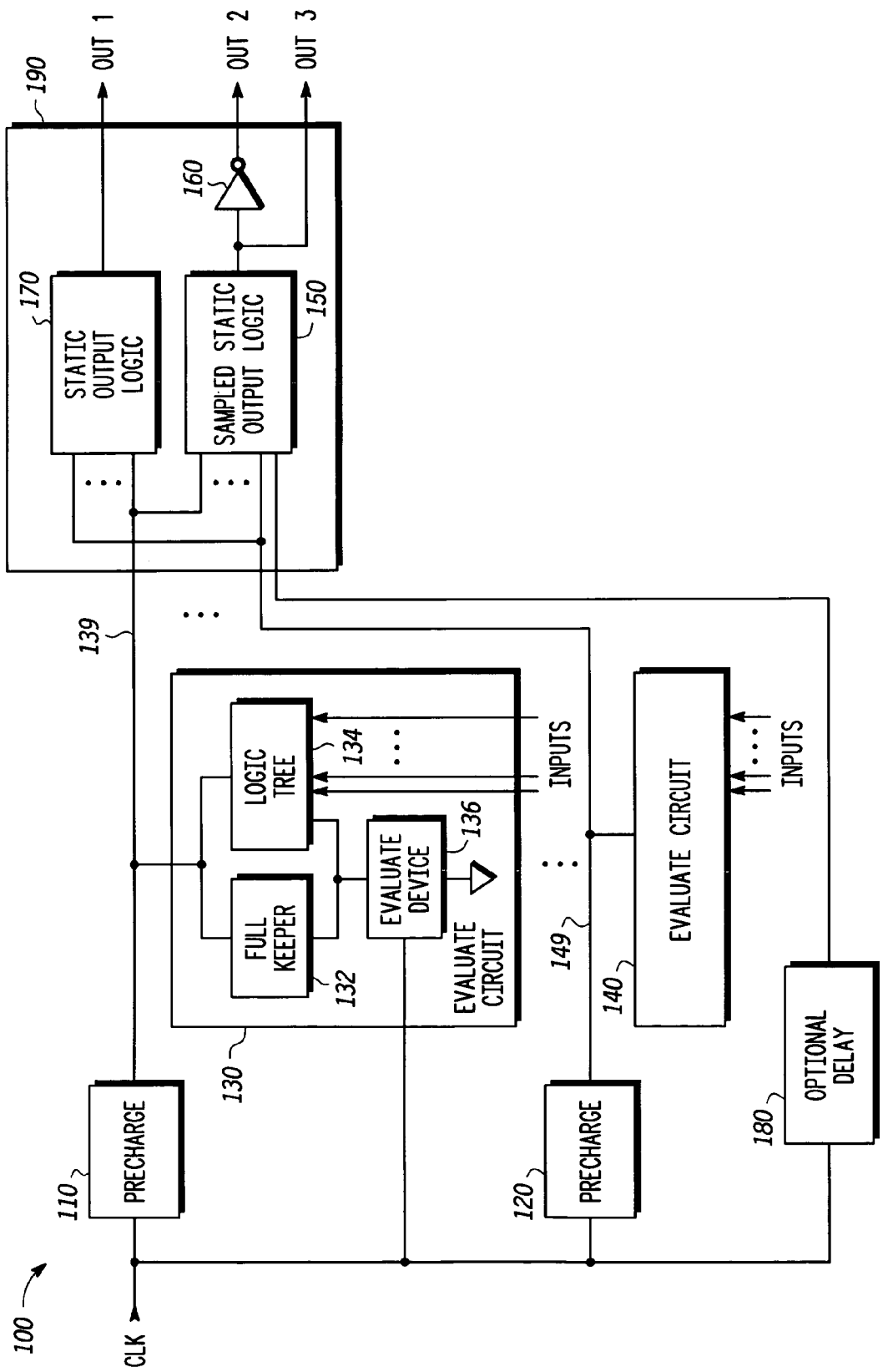
FIG. 1 is block diagram of one embodiment of a logic circuit according to the present invention.

FIG. 1 is a block diagram of a logic circuit having a plurality of evaluate circuits coupled to an output circuit.

Logic circuit 100 includes precharge circuits 110 and 120, evaluate circuits 130 and 140, optional delay 180 and output circuit 190. In the embodiment shown, precharge circuit 110, evaluate circuit 130, and output circuit 190 are coupled to dynamic node 139. Also in the embodiment shown, precharge circuit 120, evaluate circuit 140, and output circuit 190 are coupled to dynamic node 149. Logic circuit 100 also includes a clock input (CLK) and a number of data inputs (INPUTS). Each of precharge circuits 110 and 120, evaluate circuits 130 and 140, and output circuit 190 are configured to receive a clock signal. Each evaluate circuit 130 and 140 are configured to receive data input signals. Output circuit 190 is coupled to provide output signals OUT 1, OUT 2 and OUT 3.

Precharge circuits 110 and 120 precharge dynamic nodes 139 and 149, respectively according to the clock signal received at the clock input (CLK). In one embodiment, dynamic nodes 139 and 149 are precharged to a predetermined value during a first state of the clock signal. For example, precharge circuit 110 precharges dynamic node 139 to a high voltage level when the clock signal is low (e.g. at a low clock state). Precharge circuit 120 precharges dynamic node 149 to a high voltage level when the clock signal is low. After the dynamic nodes are precharged to the high voltage level, they may be selectively discharged by the corresponding evaluation logic in evaluation circuits 130 and 140 as described below.

FIG. 1 shows two evaluate circuits, each with a corresponding precharge circuit. Precharge circuit 110 corresponds to evaluate circuit 130, and precharge circuit 120 corresponds to evaluate circuit 140. As indicated by the ellipses in FIG. 1, any number of precharge and evaluate circuit pairs may be implemented in any particular embodiment of logic circuit 100.

Evaluate circuits are used to selectively discharge their respective dynamic nodes depending on the value of the data signals supplied to the inputs of the evaluate circuits. For example, evaluate circuit 130 is coupled to receive a first set of input signals and to selectively discharge dynamic node 139 depending on an evaluation of the data values of the input signals. Evaluate circuit 140 is coupled to receive a second set of input signals and to selectively discharge dynamic node 149 depending on an evaluation of the data values of the input signals.

Each evaluate circuit (130 and 140) includes logic for initiating an evaluation, for performing the evaluation according to a particular logical function, and for holding the evaluation after it has been performed. For example, evaluate circuit 130 includes evaluate device 136, full keeper 132, and logic tree 134. Logic tree 134 includes circuitry for implementing the particular logic function to be evaluated. Evaluate device 136 controls when the logic tree 134 performs the evaluation. Full keeper 132 maintains the resultant value of the evaluation on dynamic node 139 until a subsequent precharge.

Different embodiments of logic gate circuit 100 will perform different logical functions as determined by the contents of the logic tree(s) comprised therein and as determined by the output circuitry. For example, logic tree 134 may implement the functionality of a NAND gate. An exemplary NAND gate (e.g. circuit 200) is discussed below with reference to FIG. 2.

One advantage of using a full keeper 132 in each evaluate circuit is that it maintains, in some embodiments, the resultant value on the dynamic node regardless of whether input values are reset before the evaluation phase ends. This may advantageously allow for, in some embodiments, reduced hold time requirements for the inputs, thereby enabling greater flexibility in the circuit design.

Output circuit 190 is coupled to dynamic nodes 139 and 149 and is configured to provide the output signals (e.g., OUT1) responsive thereto. In some cases, the output signals (e.g., OUT2 and OUT3) are responsive to the clock signal (e.g. the output of delay circuit 180 in FIG. 1).

In the illustrated embodiment, output circuit 190 includes static output logic circuit 170, sampled static output logic circuit 150, and inverter 160. Static output logic circuit 170 has inputs coupled to dynamic nodes 139 and 149 and provides output signal OUT1 regardless of the state of the clock signal. In one embodiment, OUT1 is designed to be coupled to static or NMOS dynamic logic. Sampled static output logic circuit 150 provides output signal OUT3. Inverter 160 provides output signal OUT2 which is an inverted signal of OUT3. In one embodiment, OUT2 is a sampled static output signal and is designed to be coupled to PMOS dynamic logic, but can also be coupled to static logic. In one embodiment, OUT3 is a sampled static output signal and is designed to be coupled to NMOS dynamic logic, but can also be coupled to static logic. Sampled static output logic circuit 150 is coupled to nodes 139 and 149, and receives a clock signal.

Sampled static output logic circuit 150 receives a clock signal (from delay circuit 180) to enable sampling of the dynamic data signals on dynamic nodes 139 and 149. Sampled static output logic circuit 150 may be of any type of static logic circuit capable of sampling. Examples of such circuitry include clocked static circuitry or other circuitry such as circuitry which includes a ground coupled device that receives a clock signal. An example of such a device is a sample device (e.g., NFET 254 on FIG. 2) placed in series with devices performing the overall logic function of circuit 150. Also some sampled static output logic may include a $V_{DD}$-to-output parallel coupled device that is coupled to receive a clock signal. An example of such a device is a device (e.g., NFET 252 on FIG. 2) placed in parallel with devices performing the overall logic function of circuit 150.

In some embodiments, the logic of the sampled static output logic circuit 150 may be describable by an equation in which the outside or final operator is an AND (an AND of the clock). Some specific examples of sampled static output logic include AND-INVERT (e.g., NAND), OR-AND, OR-AND-INVERT, AND-OR-AND, AND-OR-AND-INVERT, or any logic that includes an AND or an AND-INVERT as the outside or final operator. Practitioners in the industry commonly refer to these types of logic functions by their abbreviations: AND, NAND, OA, OAI, AOA, AOAI, etc. For example, when the clock is a logical 0, the output is reset, and when the clock is a logical 1, the output provides the results of the desired logic function.

Static output logic circuit 170 differs from sampled static output logic circuit 150 in that static output logic circuit 170 does not receive a clock signal. Static output logic circuit 170 may perform any one of a number of static logical functions.

Although output circuit 190 is static logic, output signals OUT1, OUT2, and OUT3 nonetheless have dynamic signaling characteristics. An example of a signal having dynamic signaling characteristics is a signal which returns to a predetermined value during one half clock cycle (i.e., one clock state) and which exhibits a data value during the other half clock cycle (i.e., the other clock state). Such signals may be precharged low as is the case with OUT1 and OUT2. For example, OUT1 and OUT2 are low during a precharge phase of logic circuit 100 (e.g., clock signal CLK is low), and OUT1 and OUT2 carry a data value during an evaluate phase of logic circuit 100 (e.g., clock signal CLK is high). Also, in the embodiment shown, OUT3 is high during a precharge phase of logic circuit 100 (e.g., clock signal CLK is low), and OUT3 carries a data value during an evaluate phase of logic gate circuit 100. OUT3 can be used, in some embodiments, to drive static logic (or PMOS dynamic logic) and also has the advantage of being one inverter delay sooner than OUT2. As will be readily apparent to one of ordinary skill in the art, the specific configuration of output circuit 190 may be different in different embodiments of logic circuit 100.

Optional delay 180 is coupled between the clock input (CLK) and the clock input of output circuit 190. In one embodiment, delay 180 is implemented with a CMOS pass gate in a conductive configuration. In another embodiment, delay 180 is implemented with an even number of CMOS inverters. In other embodiments, delay 180 may be implemented as an extraordinary long circuit trace or series coupled capacitor to ground. Providing a delay in some embodiments may allow for dynamic nodes (e.g. 139 and 149) to reach their correct evaluate charge level in an evaluate phase before a change in state of the clock signal reaches output logic circuit 150, thereby increasing sampling margin and reliability. The need for optional delay 180 may be omitted in other embodiments by selecting appropriate characteristics of transistors of evaluate devices (e.g. 236 of FIG. 2) and transistors (e.g. 252 and 254 of FIG. 2) of the sampled static output circuits. Also, the need for optional delay 180 may be omitted by a layout arrangement where clock signals arrive at the evaluate devices (e.g. 236 of FIG. 2) before the output logic.

Figure 2:
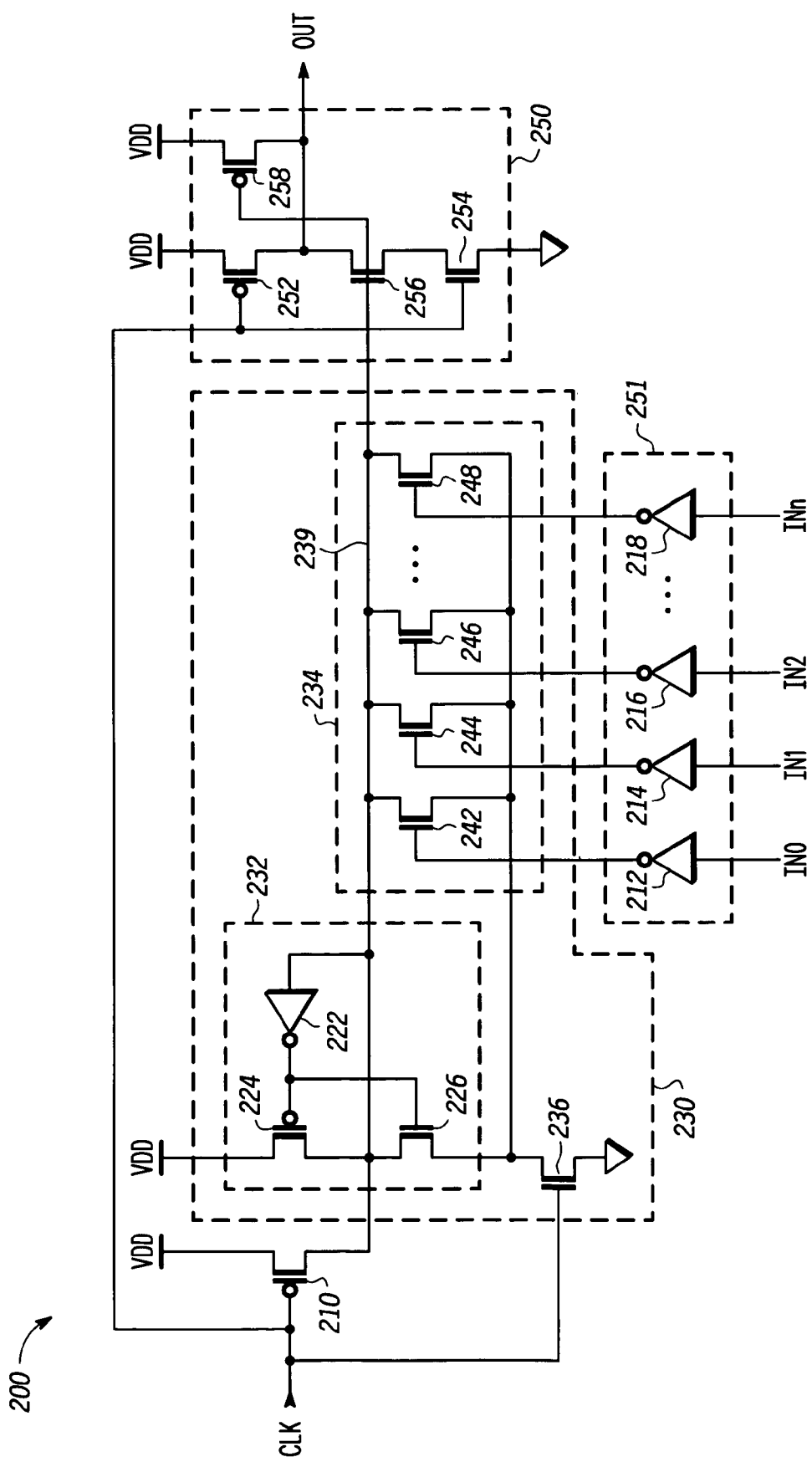
FIG. 2 is a circuit diagram of an embodiment of a logic circuit according to the present invention.

FIG. 2 shows a circuit diagram of a logic circuit 200. Logic circuit 200 includes an evaluate circuit 230, output logic 250, and inverter circuitry 251. Evaluate circuit 230 includes a precharge device, which in the embodiment shown is implemented with a PMOS transistor 210 having its gate (e.g. a control terminal for a MOS transistor) connected to clock input CLK. Evaluate circuit 230 also includes a full keeper 232, which in the embodiment shown includes PMOS transistor 224, NMOS transistor 226, and inverter 222. Evaluate circuit 230 includes an evaluate device, which in the embodiment shown is implemented with transistor 236.

Evaluate circuit 230 also includes an logic tree 234 which includes a plurality of transistors (242, 244, 246, and 248) connected in parallel. The gate of each of these transistors is coupled via an inverter of inverter circuitry 251 to a data input ($IN_0$, $IN_1$, $IN_2$, $IN_n$). Each of the transistors of tree 234 has a drain (e.g. a current terminal of a MOS transistor) connected to dynamic node 239 and a source (e.g. a current terminal of a MOS transistor) connected to the drain of transistor 236 and the source of transistor 226. In the embodiment shown, logic tree 234 is configured in an OR configuration. However, circuit 200 is configured with inverter circuitry 251 to provide an AND function of the data inputs ($IN_0$, $IN_1$, $IN_2$, $IN_n$).

Output circuit 250 is a sampled static output circuit. Circuit 250 includes transistors 252, 256, and 254 coupled in series. Circuit 250 also includes a transistor 258 having a drain connected to the output (OUT) and a gate connected to dynamic node 239. The gates of transistor 252 and 254 are connected to the clock input (CLK). In the embodiment shown, circuit 250 is a static circuit in that its output is actively driven during the precharge and evaluate phases. However, in other embodiments, static circuits may includes other configurations.

In the embodiment shown, circuit 200 does not include a delay circuit between the clock input (CLK) and output circuit 250. In some embodiments, such a delay circuit is not needed where the evaluate device (transistor 236) and the sample device (transistor 254) in output circuit 250 are sized to provide a sufficient sampling margin. However, other embodiments may utilize a delay circuit to provide a larger sampling margin.

Output circuit 250 acts as an inverter inverting the value of dynamic node 239 during the time when transistor 254 is turned on and transistor 252 is turned off by the clock signal being high. Accordingly, circuit 200 implements a logical NAND of inputs input ($IN_0$, $IN_1$, $IN_2$, $IN_n$).

Those of skill in the art will recognize that, based upon the teachings herein, circuit 200 may have other configurations and/or be implemented with other types of devices. For example, logic tree 234 may have other transistor configurations and may be implemented with other types of transistors (e.g. PMOS transistors). Also, the precharge device, evaluate device, full keeper 232, output circuit 250, and inverter circuitry 251 may have other configurations and/or may be implemented with other devices.

Figure 4:
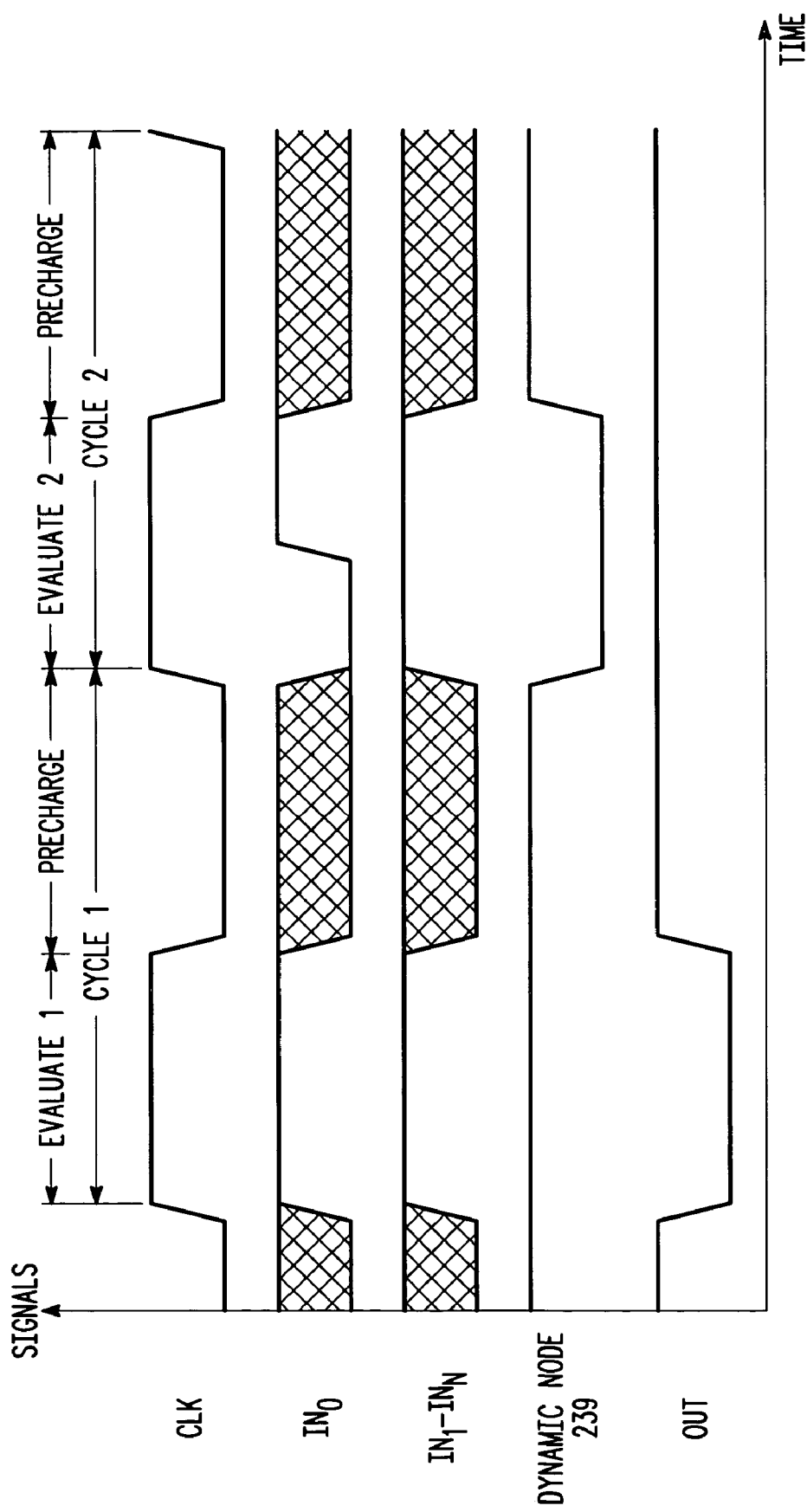
FIG. 4 is timing diagram illustrating one embodiment of the operation of the logic circuit of FIG. 2.

The operation of circuit 200 will further be described with respect to the timing diagram of FIG. 4. For the embodiment of circuit 200, the evaluate phase occurs during the time when the state of the clock signal is high and the precharge phase occurs during the time when the state of clock signal is low.

During the precharge phase, transistor 210 is conductive and transistor 236 is non conductive when the clock signal received at the clock input CLK is low. Accordingly, dynamic node 239 is precharged to the high voltage of VDD through transistor 210. Also, during the precharge phase, transistor 252 is conductive and transistor 254 is non conductive thereby pulling the output (OUT) to VDD as well.

During the evaluate phase when the clock signal is high, transistor 236 is conductive and transistor 210 is nonconductive, thereby allowing for the transistors of logic tree 234 to conditionally discharge depending upon the state of the data inputs ($IN_0$, $IN_1$, $IN_2$, $IN_n$). Accordingly, during the evaluate phase, the voltage level of node 239 will be dependent upon the state of the inputs. If none of the transistors of logic tree 234 are conductive, then the voltage level of node 239 remains at the high precharge voltage value. If at least one of the transistors of logic tree 234 is conductive, then the voltage level of node 239 is pulled to ground through transistor 236.

As shown in the example of FIG. 4, during the first evaluate phase shown (Evaluate 1), none of the transistors of logic tree 234 are conductive in that all of the inputs ($IN_0$, $IN_1$, $IN_2$, $IN_n$) are high, driving the gates of the transistor of logic tree 234 low. Thus, node 239 is high during the first evaluate phase.

During the second evaluate phase (evaluate 2), $IN_0$ is low and the other inputs $IN_1$ to $IN_n$ are high. Accordingly, node 239 transitions low during this evaluate phase in that node 239 is discharged through transistors 242 and 236 to ground.

During each evaluate phase, full keeper 232 is used to hold dynamic node 239 high or low depending upon the conditional states of the inputs. If node 239 is pulled to ground, then the output of inverter 222 is high thereby making transistor 226 conductive and transistor 224 non conductive to hold node 239 to ground via transistors 226 and 236. When node 239 is not pulled to ground through logic tree 234, then the output of inverter 222 is low, thereby making transistor 224 conductive and transistor 226 non conductive to hold node 239 to VDD through transistor 224.

Transistor 224 is a relatively weak transistor compared to the transistors of logic tree 234 such that transistor 224 does not prevent node 239 from being discharged during an evaluation phase if one of the transistors of logic tree 234 is conductive.

Using full keeper 232 enables the node 239 to remain at its evaluated value even if the inputs are reset (e.g. at a high value in FIG. 4) before the end of the evaluate phase. For example, referring to the evaluate 2 phase of FIG. 4, the value of input $IN_0$ is reset to a high value prior to the end of evaluate 2 phase and the voltage of node 239 is actively held at a low value by the full keeper 232.

During the evaluate phase, transistor 252 is non conductive and transistor 254 is conductive. Accordingly, transistors 256 and 258 behave as an inverter during the evaluate phase to invert the signal state of node 239 at the output (OUT).

Figure 3:
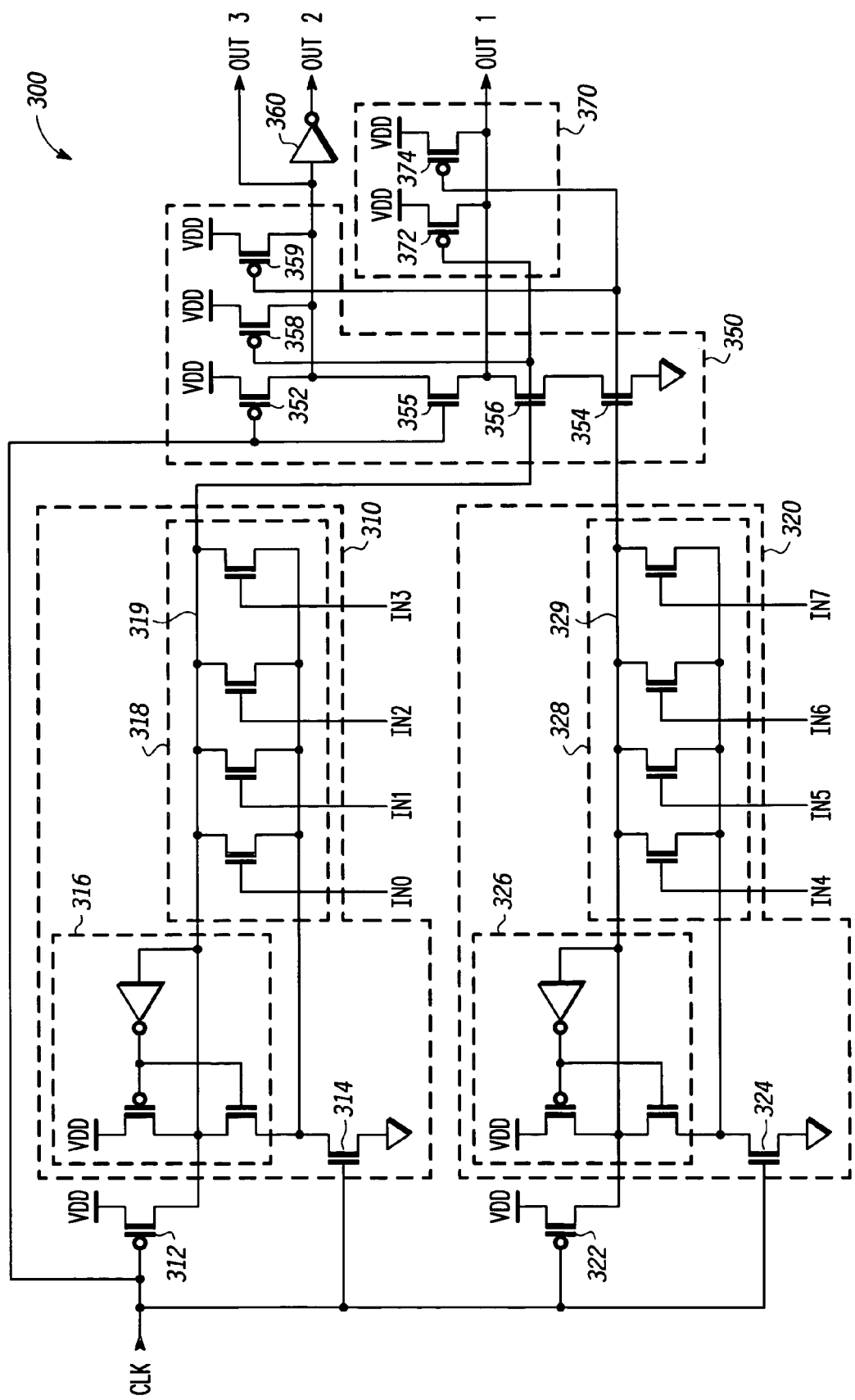
FIG. 3 is a circuit diagram of another embodiment of a logic circuit according to the present invention.

FIG. 3 shows a circuit diagram of another embodiment of a logic circuit according to the present invention. In the embodiment shown, circuit 300 implements an 8 input NOR gate.

Logic circuit 300 includes two evaluate circuits (310 and 320) and two corresponding precharge circuits (which are implemented as transistors 312 and 322 in the embodiment shown). Evaluate circuit 310 includes a four transistor logic tree 318, full keeper 316, and an evaluate device implemented as transistor 314. Evaluate circuit 320 includes a four transistor logic tree 328, full keeper 326, and an evaluate device implemented as transistor 324.

One advantage that may occur with a logic circuit having multiple evaluate circuits is that it may provide for a circuit having a wider gate fan-in (e.g. the number of data input signals) while maintaining speed and reliability. In one embodiment, because the inputs are divided up among multiple evaluate circuits, each evaluate circuit is more robust due to decreased leakage current from having less transistors on a dynamic node. In addition such a circuit may have a greater speed due to reduced dynamic load capacitance because of fewer transistors on each dynamic node.

Circuit 300 includes both a sampled static output logic circuit 350 and a static output logic circuit 370, each of which are coupled to both dynamic nodes 319 and 329. Circuit 350 implements a 3 input NAND gate, one of the inputs is coupled to the clock line. Circuit 370, together with transistors 354 and 356 implements a two input NAND gate, with its inputs coupled to the dynamic nodes 319 and 329. The state of OUT 2 is inverted from the state of OUT 3 by inverter 360.

During the precharge phase, OUT 1 and OUT 2 are precharged low and OUT 3 is precharged high. During the evaluate phase, one of OUT 1 or OUT 2 will go high with the other remaining low depending upon the state of the logic nodes.

In other embodiments, the output logic circuits 350 and 370 may have other configurations. For example, transistors 354 and 356 maybe coupled in parallel with their drains connected the source of transistor 355 to implement an OR configuration. With this embodiment, transistors 358 and 359 would be coupled in series as well as transistors 372 and 374 be coupled in series.

Although only two evaluate circuits (310 and 320) are shown in FIG. 3, other embodiments may have a different number of evaluate circuits. In one embodiment where logic circuit 300 includes an additional evaluate circuit (similar to evaluate circuits 310 and 320), the dynamic node of the additional evaluate circuit would be connected to a NFET transistor coupled in series with transistors 356 and 354 between ground and transistor 355.

In some embodiments, having separate evaluate (e.g. 314, 324) and sample devices (e.g. 355) allows for better control of an internal race (when the dynamic node evaluates (discharges) the output node does not come down). One way to control the internal race is to adjust the relative sizes (e.g., lengths, widths) and the relative threshold voltages of the separate devices.

Some of the above embodiments of the invention provide a NAND output circuit without exposing the dynamic node (e.g. 139) of the dynamic circuit. Some prior circuits can compute AND and OR logical functionality with N gate delays, and compute NAND and NOR with one more gate delay (N+1 gate delays) than they compute AND and OR functionality (N gate delays). Whereas some embodiments in accordance with the invention can compute NAND and NOR functionality with one less gate delay (N-1 gate delays) than they can compute AND and OR (N gate delays). Therefore, some of the presently discussed embodiments of the invention can compute NAND and NOR logic functionality with two less gate delays than prior circuitry.

With some prior dynamic logic gates, three timing conditions must be met to function correctly. Those conditions are: 1) Falling edges of the inputs must meet strict setup requirements against the evaluate clock; 2) Rising edges of the inputs must meet strict setup requirements against the evaluate clock, and 3) The dynamic node must discharge fast enough to prevent an input node of an output stage from discharging. With some embodiments, only one condition, falling edges of the inputs must meet strict setup requirements against the evaluate clock, must be met to function correctly.

Because with some embodiments, the output circuit is a static NAND gate, the other timing requirements need not be met if the downstream logic is glitch insensitive (as is the case with static logic gates). The three conditions in the proceeding paragraph are still necessary if glitches cannot be tolerated (as with domino logic gates). But glitch suppression may be much easier with the static NAND than with a prior full latch on the output. This may allow for a more aggressive margin between the dynamic node falling and the clocked input to the NAND falling, thereby achieving better performance in some embodiments.

Also, some embodiments of a logic circuit may be less sensitive to internal noise sources due to the dynamic node driving a static NAND (e.g. or other type of static output circuit) than with some prior logic gate circuits. Furthermore, because the output is static logic, the dynamic node may be immune to noise on the output in some embodiments unlike some prior logic gate circuits.

Regarding the optional nature of disclosed elements (e.g., optional delay 180), note that the specific identification in this application of a particular circuit as being optional does not by itself imply that other circuitry not so identified is required. Such optional identification is offered as a guide to practitioners implementing various embodiments of the invention, and not to define the scope of the invention itself.

Some embodiments of the present invention may provide for wide logic computation with relaxed input timing constraints, a statically driven noise-robust output, and compatibility with dynamic logic circuits.

In one embodiment, a logic circuit includes an evaluate circuit having a plurality of inputs. The evaluate circuit includes a dynamic node. The evaluate circuit includes an evaluate device having an input coupled to a clock line. The evaluate circuit includes a full keeper coupled to the dynamic node. The logic circuit also includes a static output circuit including a first input coupled to the dynamic node. The static output circuit including a sample device. The sample device includes an input coupled to a clock line. The static output circuit includes an output.

In another embodiment, a logic circuit includes a first evaluate circuit including a first plurality of inputs. The first evaluate circuit includes a first dynamic node. The logic circuit includes a second evaluate circuit including a second plurality of inputs. The second evaluate circuit includes a second dynamic node. The static output circuit includes a first input coupled to the first dynamic node. The static output circuit includes a second input coupled to the second dynamic node. The static output circuit includes a sample device including an input coupled to a clock line. The static output circuit includes an output.

In another embodiment, a logic circuit includes an evaluate circuit having a plurality of inputs. The evaluate circuit includes a dynamic node. The evaluate circuit includes an evaluate transistor having an input coupled to a clock line. The evaluate circuit includes a full keeper. The full keeper includes a first transistor having a first current terminal coupled to a voltage supply and a second current terminal connected to the dynamic node. The full keeper includes a second transistor having a first current terminal connected to the dynamic node. The first transistor and the second transistor each include a control terminal coupled to the dynamic node. The logic circuit includes a static output circuit includes a third transistor having a control terminal coupled to the dynamic node. The static output circuit includes a sample transistor having a control terminal coupled to a clock line. The static output circuit includes an output. The third transistor and the sample transistor are coupled in series.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

Numerical terms (e.g. "first," "second," and "third") are used in the claims as arbitrary descriptors of similar items for differentiation in the claims. They do not imply that a particular item includes that number of items. For example, the phrase "a transistor having a third current terminal" does not mean that the transistor has three current terminals. Rather, the term "third" in the phrase "third current terminal" is used to distinguish the particular current terminal from other current terminals (e.g. first and second current terminals) in the claim.

What is claimed is:

1. A logic circuit comprising:
    an evaluate circuit having a plurality of inputs, the evaluate circuit including a dynamic node, the evaluate circuit including an evaluate device having an input coupled to a clock line, the evaluate circuit including a full keeper coupled to the dynamic node;
    a static output circuit including a first input coupled to the dynamic node, the static output circuit including a sample device, the sample device including an input coupled to the clock line, the static output circuit including an output;
    a second evaluate circuit having a second plurality of inputs, the second evaluate circuit including a second dynamic node, the second evaluate circuit including a second evaluate device having an input coupled to a clock line, the second evaluate circuit including a second full keeper coupled to the second dynamic node;
    wherein the static output circuit includes a second input coupled the second dynamic node;
    wherein the full keeper includes:
        a first transistor having a first current terminal coupled to a first voltage supply, the first transistor having a second terminal coupled to the dynamic node;
        a second transistor having a third current terminal coupled to the dynamic node;
        wherein the first transistor, the second transistor, and the evaluate device are coupled in series.

2. The logic circuit of claim 1 wherein:
    the evaluate device includes a transistor.

3. The logic circuit of claim 1 wherein the sample device includes a transistor.

4. The logic circuit of claim 3 wherein:
    the static output circuit includes a second transistor having a control terminal coupled to the first input;
    the transistor is coupled in series to the second transistor.

5. The logic circuit of claim 1 wherein a control terminal for the first transistor and a control terminal for the second transistor are connected.

6. The logic circuit of claim 1 wherein a control terminal for the first transistor and a control terminal for the second transistor are each coupled to the dynamic node.

7. The logic circuit of claim 6 wherein the control terminal for the first transistor and the control terminal for the second transistor are each coupled to the dynamic node via an inverter.

8. The logic circuit of claim 1 wherein the second transistor includes a fourth current terminal coupled to a current terminal of the evaluate device.

9. The logic circuit of claim 8 wherein:
    the evaluate device includes a third transistor, the fourth current terminal is connected to a current terminal of the third transistor.

10. The logic circuit of claim 1 wherein:
    the second terminal is characterized as a current terminal.

11. The logic circuit of claim 1 wherein the static output circuit is a sampled static output circuit.

12. The logic circuit of claim 1 further comprising:
    an inverter having an input connected to the output.

13. The logic circuit of claim 1 wherein the plurality of inputs are coupled in one of an AND configuration or an OR configuration.

14. The logic circuit of claim 1 further comprising:
    a delay circuit, the input of the sample device being coupled to the clock line via the delay circuit.

15. A logic circuit comprising:
    an evaluate circuit having a plurality of inputs, the evaluate circuit including a dynamic node, the evaluate circuit including an evaluate device having an input coupled to a clock line, the evaluate circuit including a full keeper coupled to the dynamic node;
    a static output circuit including a first input coupled to the dynamic node, the static output circuit including a sample device, the sample device including an input coupled to the clock line, the static output circuit including an output;
    wherein the static output circuit implements a logic function described by an equation in which an outside operator is one of an AND or AND-INVERT;

a precharge circuit, the precharge circuit having an output to precharge the dynamic node, the precharge circuit having an input coupled to the clock line.

16. The logic circuit of claim 15 further comprising:
a second evaluate circuit having a second plurality of inputs, the second evaluate circuit including a second dynamic node, the second evaluate circuit including a second evaluate device having an input coupled to the clock line, the second evaluate circuit including a second full keeper coupled to the second dynamic node;
wherein the static output circuit includes a second input coupled the second dynamic node.

17. A logic circuit comprising:
an evaluate circuit having a plurality of inputs, the evaluate circuit including a dynamic node, the evaluate circuit including an evaluate device having an input coupled to a clock line, the evaluate circuit including a full keeper coupled to the dynamic node;
a static output circuit including a first input coupled to the dynamic node, the static output circuit including a sample device, the sample device including an input coupled to the clock line, the static output circuit including an output;
a second evaluate circuit having a second plurality of inputs, the second evaluate circuit including a second dynamic node, the second evaluate circuit including a second evaluate device having an input coupled to a clock line, the second evaluate circuit including a second full keeper coupled to the second dynamic node;
wherein the static output circuit includes a second input coupled the second dynamic node;
wherein the static output circuit includes a transistor having a control terminal connected to the dynamic node, a first current terminal connected to the output of the static output circuit, and a second current terminal coupled to a voltage supply.

18. A logic circuit comprising:
an evaluate circuit having a plurality of inputs, the evaluate circuit including a dynamic node, the evaluate circuit including an evaluate device having an input coupled to a clock line, the evaluate circuit including a full keeper coupled to the dynamic node;
a static output circuit including a first input coupled to the dynamic node, the static output circuit including a sample device, the sample device including an input coupled to the clock line, the static output circuit including an output;
a second evaluate circuit having a second plurality of inputs, the second evaluate circuit including a second dynamic node, the second evaluate circuit including a second evaluate device having an input coupled to a clock line, the second evaluate circuit including a second full keeper coupled to the second dynamic node;
wherein the static output circuit includes a second input coupled the second dynamic node;
wherein the evaluate circuit includes a plurality of transistors, each transistor of the plurality includes a first current terminal connected to the dynamic node and a second current terminal connected to a current terminal of the evaluate device.

19. A logic circuit comprising:
an evaluate circuit having a plurality of inputs, the evaluate circuit including a dynamic node, the evaluate circuit including an evaluate device having an input coupled to a clock line, the evaluate circuit including a full keeper coupled to the dynamic node;
a static output circuit including a first input coupled to the dynamic node, the static output circuit including a sample device, the sample device including an input coupled to the clock line, the static output circuit including an output;
a second evaluate circuit having a second plurality of inputs, the second evaluate circuit including a second dynamic node, the second evaluate circuit including a second evaluate device having an input coupled to a clock line, the second evaluate circuit including a second full keeper coupled to the second dynamic node;
wherein the static output circuit includes a second input coupled the second dynamic node;
a precharge circuit, the precharge circuit having an output to precharge the dynamic node, the precharge circuit having an input coupled to the clock line.

20. The logic circuit of claim 19 wherein:
the dynamic node is at a voltage dependent upon voltages of the plurality of inputs when a clock signal applied at the input of the sample device is at a first clock state;
the voltage of the dynamic node is at a predetermined voltage when a clock signal applied to the input of the precharge circuit is at a second clock state opposite the first clock state.

21. A logic circuit comprising:
a first evaluate circuit including a first plurality of inputs, the first evaluate circuit including a first dynamic node;
a second evaluate circuit including a second plurality of inputs, the second evaluate circuit including a second dynamic node;
a static output circuit including a first input coupled to the first dynamic node, the static output circuit including a second input coupled to the second dynamic node, the static output circuit including a sample device including an input coupled to a clock line, the static output circuit including an output;
wherein:
the first evaluate circuit includes a first full keeper coupled to the first dynamic node;
the second evaluate circuit includes a second full keeper coupled to the second dynamic node;
the static output circuit includes a first transistor having a control terminal coupled to the first input;
the static output circuit include a second transistor having a control terminal coupled to the second input;
the sample device includes a third transistor having a control terminal coupled to the clock line;
the third transistor is coupled in series with the first transistor;
the third transistor is coupled in series with the second transistor.

22. The logic circuit of claim 21 wherein the first transistor and the second transistor are coupled in series.

23. The logic circuit of claim 21 wherein the first transistor and the second transistor are coupled in parallel.

24. The logic circuit of claim 21 further comprising:
a third evaluate circuit having a third plurality of inputs, the third evaluate circuit including a third dynamic node;
wherein the static output circuit includes a third input coupled to the third dynamic node.

25. The logic circuit of claim 21 wherein:
the first evaluate circuit includes a first evaluate device having an input coupled to the clock line;
the second evaluate circuit includes a second evaluate device having an input coupled to the clock line.

26. The logic circuit of claim 25 wherein:
the first dynamic node is at a voltage dependent upon voltages of the first plurality of inputs when a clock signal applied at the input of the first evaluate device is at a first clock state;
the second dynamic node is at a voltage dependent upon voltages of the second plurality of inputs when a clock signal applied at the input of the second evaluate device is at a first clock state.

27. The logic circuit of claim 26 wherein:
the first dynamic node is at a predetermined voltage when a clock signal applied at the input of the first evaluate device is at a second clock state opposite the first clock state;
the second dynamic node is at a predetermined voltage when a clock signal applied at the input of the second evaluate device is at a second clock state opposite the first clock state.

28. The logic circuit of claim 21 wherein:
the first evaluate circuit includes a first logic tree including inputs coupled to the first plurality of inputs;
the second evaluate circuit includes a second logic tree including inputs coupled to the second plurality of inputs.

29. The logic circuit of claim 21 wherein the static output circuit implements a logical NAND function at its output.

30. A logic circuit comprising:
a first evaluate circuit including a first plurality of inputs, the first evaluate circuit including a first dynamic node;
a second evaluate circuit including a second plurality of inputs, the second evaluate circuit including a second dynamic node;
a static output circuit including a first input coupled to the first dynamic node, the static output circuit including a second input coupled to the second dynamic node, the static output circuit including a sample device including an input coupled to a clock line, the static output circuit including an output;
wherein:
the static output circuit includes a first transistor having a control terminal coupled to the first input;
the static output circuit include a second transistor having a control terminal coupled to the second input;
the sample device includes a third transistor having a control terminal coupled to the clock line;
the third transistor is coupled in series with the first transistor;
the third transistor is coupled in series with the second transistor;
the static output circuit further comprises a fourth transistor, the fourth transistor includes a control terminal coupled to the clock line;
the fourth transistor is coupled in series with the first transistor;
the fourth transistor is coupled in series with the second transistor;
the fourth transistor is coupled in series with the third transistor.

31. The logic circuit of claim 30 wherein the fourth transistor is of a first conductivity type and the third transistor is of a second conductivity type opposite the first conductivity type.

32. A logic circuit comprising:
a first evaluate circuit including a first plurality of inputs, the first evaluate circuit including a first dynamic node;
a second evaluate circuit including a second plurality of inputs, the second evaluate circuit including a second dynamic node;
a static output circuit including a first input coupled to the first dynamic node, the static output circuit including a second input coupled to the second dynamic node, the static output circuit including a sample device including an input coupled to a clock line, the static output circuit including an output;
a third evaluate circuit having a third plurality of inputs, the third evaluate circuit including a third dynamic node;
wherein:
the first evaluate circuit includes a first full keeper coupled to the first dynamic node;
the second evaluate circuit includes a second full keeper coupled to the second dynamic node;
wherein the static output circuit includes a third input coupled to the third dynamic node;
the static output circuit includes a first transistor having a control terminal coupled to the first input;
the static output circuit includes a second transistor having a control terminal coupled to the second input;
the static output circuit include a third transistor having a control terminal coupled to the third input;
the sample device includes a fourth transistor having a control terminal coupled to the clock line;
the fourth transistor is coupled in series with the first transistor;
the fourth transistor is coupled in series with the second transistor;
the fourth transistor is coupled in series with the third transistor.

33. A logic circuit comprising:
an evaluate circuit having a plurality of inputs, the evaluate circuit including a dynamic node, the evaluate circuit including an evaluate transistor having an input coupled to a clock line, the evaluate circuit including a full keeper, the full keeper including a first transistor having a first current terminal coupled to a voltage supply and a second current terminal connected to the dynamic node, the full keeper including a second transistor having a first current terminal connected to the dynamic node, the first transistor and the second transistor each including a control terminal coupled to the dynamic node;
a static output circuit including a third transistor having a control terminal coupled to the dynamic node, the static output circuit including a sample transistor having a control terminal coupled to the clock line, the static output circuit including an output, the static output circuit including a fourth transistor having a control terminal coupled to the clock line coupled to the control terminal of the sample transistor, wherein the third transistor, the fourth transistor, and the sample transistor are coupled in series.

34. The logic circuit of claim 33 wherein the output is coupled a current terminal of the third transistor.

35. The logic circuit of claim 33 wherein the static output circuit further includes:
   a fourth transistor having a control terminal coupled to the dynamic node, a first current terminal coupled to the output, and a second current terminal coupled to a voltage supply.

36. The logic circuit of claim 33 wherein the control terminal of the sample transistor is coupled to a delay circuit.

* * * * *